United States Patent
Schmidt et al.

(10) Patent No.: US 9,442,019 B2
(45) Date of Patent: Sep. 13, 2016

(54) INFRARED IMAGING PROBE

(75) Inventors: Matthew F. Schmidt, River Falls, WI (US); Thomas J. McManus, Plymouth, MN (US)

(73) Assignee: Fluke Corporation, Everett, WA (US)

( * ) Notice: Subject to any disclaimer, the term of this patent is extended or adjusted under 35 U.S.C. 154(b) by 769 days.

(21) Appl. No.: 12/647,175

(22) Filed: Dec. 24, 2009

(65) Prior Publication Data

US 2010/0163730 A1 Jul. 1, 2010

Related U.S. Application Data (60) Provisional application No. 61/140,912, filed on Dec. 26, 2008.

(51) Int. Cl.
| | | |
|---|---|---|
| *H01L 31/09* | (2006.01) | |
| *G01J 5/10* | (2006.01) | |
| *G01J 5/08* | (2006.01) | |
| *G01J 5/04* | (2006.01) | |
| *G01J 5/02* | (2006.01) | |
| *G01J 5/00* | (2006.01) | |
| *H01L 27/146* | (2006.01) | |

(52) U.S. Cl.
CPC ............... *G01J 5/10* (2013.01); *G01J 5/0066* (2013.01); *G01J 5/02* (2013.01); *G01J 5/0265* (2013.01); *G01J 5/08* (2013.01); *G01J 5/0821* (2013.01); *G01J 5/0096* (2013.01); *G01J 5/025* (2013.01); *G01J 5/046* (2013.01); *G01J 5/047* (2013.01); *G01J 2005/0077* (2013.01); *G01J 2005/0081* (2013.01); *H01L 27/14649* (2013.01)

(58) Field of Classification Search
USPC ..................................................... 250/339.14
See application file for complete search history.

(56) References Cited

U.S. PATENT DOCUMENTS

| | | | |
|---|---|---|---|
| 4,391,584 A | | 7/1983 | Daniel |
| 4,491,865 A | * | 1/1985 | Danna et al. .................. 348/71 |
| 4,711,979 A | | 12/1987 | Glasser et al. |
| RE33,857 E | | 3/1992 | Ariessohn et al. |
| 5,408,263 A | * | 4/1995 | Kikuchi et al. ................ 348/68 |
| 5,561,294 A | | 10/1996 | Iddan |
| 5,604,532 A | | 2/1997 | Tillmanns |
| 5,713,666 A | | 2/1998 | Seelin et al. |
| 6,107,606 A | | 8/2000 | Hotchkiss |
| 6,508,809 B1 | * | 1/2003 | Bacher ................. A61G 13/107 439/488 |
| 6,638,212 B1 | * | 10/2003 | Oshima ........................ 600/109 |
| 6,652,452 B1 | * | 11/2003 | Seifert et al. ................ 600/140 |
| 6,667,761 B1 | | 12/2003 | Ludwig et al. |
| 6,806,900 B2 | | 10/2004 | Eversole et al. |
| 7,307,793 B2 | | 12/2007 | Ottney et al. |
| 2001/0031912 A1 | * | 10/2001 | Adler ............................ 600/109 |
| 2001/0040216 A1 | * | 11/2001 | Knauth et al. ................ 250/352 |
| 2001/0045516 A1 | * | 11/2001 | Emanuel et al. ............. 250/332 |
| 2002/0018589 A1 | * | 2/2002 | Beuker et al. ................ 382/132 |
| 2002/0074370 A1 | * | 6/2002 | Quintana et al. ............. 224/262 |
| 2004/0189028 A1 | * | 9/2004 | Newman et al. ............. 294/19.1 |
| 2005/0080318 A1 | * | 4/2005 | Squicciarini .................. 600/114 |
| 2007/0282165 A1 | * | 12/2007 | Hopkins et al. ............. 600/109 |
| 2008/0183033 A1 | * | 7/2008 | Bern et al. ................... 600/101 |
| 2009/0003822 A1 | * | 1/2009 | Tyner ........................... 396/428 |

* cited by examiner

*Primary Examiner* — David Porta
*Assistant Examiner* — Shun Lee
(74) *Attorney, Agent, or Firm* — Fredrikson & Byron, P.A.

(57) ABSTRACT

An infrared imaging probe that includes an elongated wand and an electrically isolating connection between the imaging components, located at the distal end of the wand, and the image processing components, located at the proximal end of the wand.

20 Claims, 5 Drawing Sheets

INFRARED IMAGING PROBE

PRIORITY CLAIM

The present application claims priority to U.S. Provisional Patent Application No. 61/140,912, entitled INFRARED IMAGING PROBE, and filed Dec. 26, 2008, the disclosure of which is herein incorporated by reference in its entirety.

BACKGROUND

Infrared (IR) imaging devices can be used, for example, for the purpose of obtaining thermal images of an object by absorbing IR energy irradiated from the targeted object. From such images, the surface temperature distribution of the object can be obtained and analyzed. IR imaging devices require a line of sight to deliver a suitably accurate thermal image. But it can often be difficult to obtain a line of sight view of components that need to be thermally imaged.

IR imaging has been found particularly useful for analyzing heat distribution of electrically charged components. For example, in the preventative maintenance of high voltage electrical circuits and components an IR image of the components can often reveal hot spots which may indicate malfunctioning, improperly connected, or overloaded components. Timely identification of problem components can save on system downtime and expenses associated with replacing blown or destroyed components. However, the location of such components may be difficult to reach and may be located in hazardous, electrical environments, such as the interior of an electrical cabinet. In another application, an IR imaging device can be used as a bench tool for a technician or engineer in the design and testing of printed circuit boards, integrated circuits, and other electronic device components.

SUMMARY

Certain embodiments of the invention relate to an infrared imaging probe having a front-end assembly coupled to a distal end of the wand. The front-end assembly includes a lens, a focal plane array, and distal circuitry. The lens is configured to receive image information in the form of infrared energy and direct the infrared energy onto the focal plane array. The distal circuitry is adapted to process signals from the focal plane array and produce an output signal. Processing circuitry is connected to and electrically isolated from the distal circuitry. The processing circuitry provides an output connection that is connectable to one or more output/control devices. The processing circuitry is adapted to receive and process the output signal for transmission to the one or more output/control devices via the output connection.

Certain embodiments of the invention relate to an infrared imaging probe system including a wand, one or more output devices, and an electrically isolating connector. The wand includes a front-end assembly coupled to a distal end of the wand that is configured to receive image information in the form of infrared energy and process the image information to produce an output signal. The electrically isolating connector connects the front-end assembly to the one or more output devices.

Certain embodiments of the invention relate to a method of thermally imaging components within an enclosed cabinet. The method includes providing an infrared imaging system including a wand having a front-end assembly sized to fit through an access opening in the cabinet and coupled to a distal end of the wand. The front-end assembly includes a lens, a focal plane array, and distal circuitry. The wand further includes processing circuitry connected to and electrically isolated from the front-end assembly. The method also includes providing one or more output devices connected to the infrared imaging system. Further, the method includes inserting the distal end of the wand through the access opening within the panel of the cabinet and maneuvering the distal end of the wand to provide the lens a view of the components.

Certain embodiments of the invention relate to an infrared imaging probe that includes an elongate wand, an image collecting assembly, and processing circuitry. The image collecting assembly is coupled to a distal end of the wand and is configured to receive image information in the form of infrared energy and process the image information to produce an output signal. The processing circuitry is connected to and electrically isolated from the image collecting assembly, and the processing circuitry is adapted to process the output signal for output to one or more output devices.

BRIEF DESCRIPTION OF THE DRAWINGS

The following drawings are illustrative of particular embodiments of the invention and therefore do not limit the scope of the invention. The drawings are not to scale (unless so stated) and are intended for use in conjunction with the explanations in the following detailed description. Embodiments of the invention will hereinafter be described in conjunction with the appended drawings, wherein like numerals denote like elements.

DETAILED DESCRIPTION OF THE DRAWINGS

For the purpose of promoting an understanding of the principles of the invention, reference will now be made to the embodiments illustrated in the drawing and specific language will be used to describe the same. It will, nevertheless, be understood that no limitation of the scope of the invention is thereby intended; any alterations and further modifications of the described or illustrated embodiments, and any further applications of the principles of the invention as illustrated therein, are contemplated as would normally occur to one skilled in the art to which the invention relates.

Figure 1:
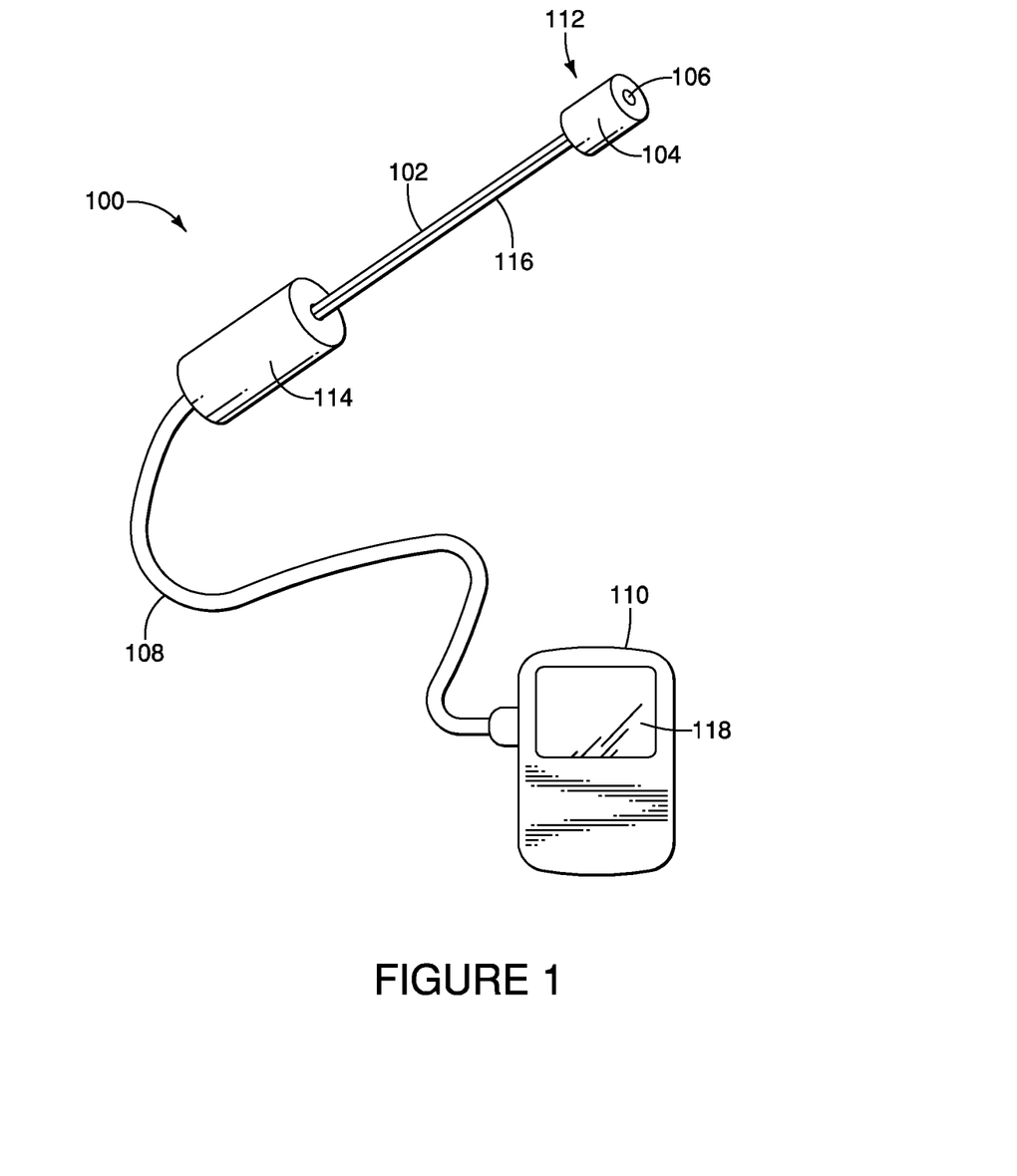
FIG. 1 is a perspective view of an infrared imaging device connected with an output/control device, according to some embodiments of the invention.

FIG. 1 shows a perspective view of an infrared imaging probe 100 (or thermal imaging device) according to an embodiment of the invention. The infrared imaging probe 100 provides an electrically isolated infrared camera which can be especially useful for viewing hard-to-reach, hazardous areas, such as the interior of an electrical cabinet, or as a bench tool for viewing small components at close range. In particular, the infrared imaging probe 100 includes a wand 102, a distal housing 104, a lens 106, and an output connection 108 connectable to one or more output/control devices 110. That is, the infrared imaging probe 100 may be merely a thermal imaging probe that connects to one or more different output/control devices 110. In addition, the infrared imaging probe includes various electronics located within the distal housing 104 and connected thereto as will be described with reference to FIG. 2.

Referring to the embodiment of FIG. 1, an infrared imaging probe 100 according to the invention includes a front-end assembly 112 mounted at the distal end of a wand 102. The front-end assembly 112 can include a distal housing 104 that houses the lens 106, focal plane array, and distal circuitry of the infrared imaging probe 100. Lens 106 can be configured to receive image information from a targeted scene in the form of infrared energy and direct the infrared energy onto front-end imaging components within the distal housing 104. The wand enables a user to manipulate the distal housing 104 and lens 106 by gripping a handle 114 or grip coupled to the proximal end of the wand 102. The relatively small package size of the distal housing 104 and agility provided by the wand 102 allow the infrared imaging probe to be used to obtain thermal images from a target scene that may be otherwise unreachable by the user with a traditional thermal imaging device. An isolating connection 116, transmits collected scene image information from the front-end assembly 112 to electrically isolated processing circuitry which, in some embodiments, is housed within the handle 114. The processing circuitry processes and transmits the output signal to one or more output/control devices 110 via an output connection 108. The output/control device 110 is used to display the image on a display 118 and/or store in memory for future use.

In the embodiment of FIG. 1, the distal housing 104 is a generally cylindrical body fixedly coupled at the distal end of the wand 102. The distal housing 104 is generally rigid and in some embodiments and can comprise and injection molded plastic. Further, some embodiments include an insulating layer lining the distal housing 104 to shield electronics disposed therein. For certain applications, the distal housing 104 must be maintained within certain package dimensions. For example, in one embodiment, the diameter of a cylindrical distal housing 104 is less than 12 mm so that the infrared imaging probe can be used for inspection of electrical cabinets having a 12 mm viewing port. Sizing considerations can further determine where to locate the infrared imaging probe 100 electronics (discussed below). Generally, the fewer components installed at the distal end of the wand 102, the smaller the necessary distal housing 104 size. Moreover, while the distal housing 104 of FIG. 1 is fixedly coupled with the wand 102, one should appreciate that other connections are within the scope of the invention. For example, some embodiments may include a hinged connection between the distal housing 104 and wand 102 to allow for articulation of the tip of the infrared imaging probe 100.

Installed within the distal surface of the distal housing 104, the lens 106 directs image information from the target scene onto the thermal imaging components therein. Lenses are well known in the art and any suitable lens material, shape, and character of appropriate size can be used. In some embodiments, the lens 106 can be a fixed focus lens having a standard field of view, a narrow field of view or a wide angle field of view. When the infrared imaging probe 100 is used as a bench tool, for example, for obtaining thermal images of a printed circuit board in operation within a device, a close focus lens having a narrow field of view may be preferred. Whereas a wide angle lens may be more appropriate, for example, in preventative maintenance of high voltage electronic devices kept within electrical cabinets. In other embodiments, the lens 106 may have an adjustable focus and field of view. Focus and field of view adjustments can be accomplished manually or automatically, and embodiments incorporating such features should include appropriate controls (electronic or otherwise) for accomplishing such adjustments.

The wand 102 is a generally elongate member that provides a fixed or adjustable separation distance between the proximal and distal ends of the infrared imaging probe 100. Suitable wands 102, according to embodiments of the invention, comprise a non-conductive material so that the infrared imaging probe 100 can be used to view electrically charged components such as, for example, in the inspection of high power electrical components within an enclosed cabinet. The wand 102 can be rigid, semi-rigid, or flexible. A flexible wand, can be useful for manipulating the infrared imaging probe 100 into a shape appropriate for accessing hard to reach target scenes. However, the wand 102 should be sturdy enough to support the distal housing in the desired arrangement. Suitable wand materials can include, for example, carbon fiber, fiberglass, plastic, or other polymers. Other adjustable wand characteristics can be provided as well. For example, in some embodiments, the wand 102 can be a telescoping wand for adjusting the wand 102 length.

In some embodiments, an isolating connection 116 can extend along the length of the wand 102 between the distal housing 104 and the infrared imaging probe's 100 processing circuitry. The type of isolating connection 116 used depends upon the on the electrically isolating connection between the front-end stages and the processing circuitry (see discussion below). For example, in embodiments where the electrically isolating connection comprises an opto-electric connection, the isolating connection 116 could be a length of fiber optic cable. In some embodiments, such as where the electrical isolation is accomplished by wireless communication, the infrared imaging probe 100 may not include a separate isolating connection. While FIG. 1 shows the isolating connection 116 as being coupled to and alongside the wand 102, many other arrangements should be appreciated. For example, the isolating connection 116 need not be coupled with the wand 102 at all so long as the front-end assembly 112 communicates with the processing circuitry. Alternatively, the wand 102 can be hollow having an interior lumen along the wand 102 length through which the isolating connection 116 can pass. Moreover, in some embodiments the wand 102 and isolating connection 116 can be combined, for example, the wand 102 could comprise a rigid fiber optic material for relaying an optical signal.

At the proximal end of the wand 102, some embodiments include a handle 114. The handle 114 can provide a grip for the user such that the infrared imaging probe 100 is easier to manipulate. In addition, the handle 114 can house the infrared imaging probe's 100 processing circuitry, controls, and/or other proximally located electronics.

Finally the infrared imaging probe 100 may include an output connection 108 for operatively coupling the infrared imaging probe 100 to an output/control device 110. The output connection 108 can be any connection capable of transmitting the processed scene information and data to the output/control device 110. Preferably, the output connection 108 is a standard connection (e.g. USB, Firewire, or Ethernet) with respective standard connectors on either end so that the infrared imaging probe 100 can be easily adapted for use with a variety of output/control devices 110. In some embodiments, the output connection 108 can be a wireless antenna for wirelessly connecting with an output/control device 110 via a wireless communication protocol.

Figure 2:
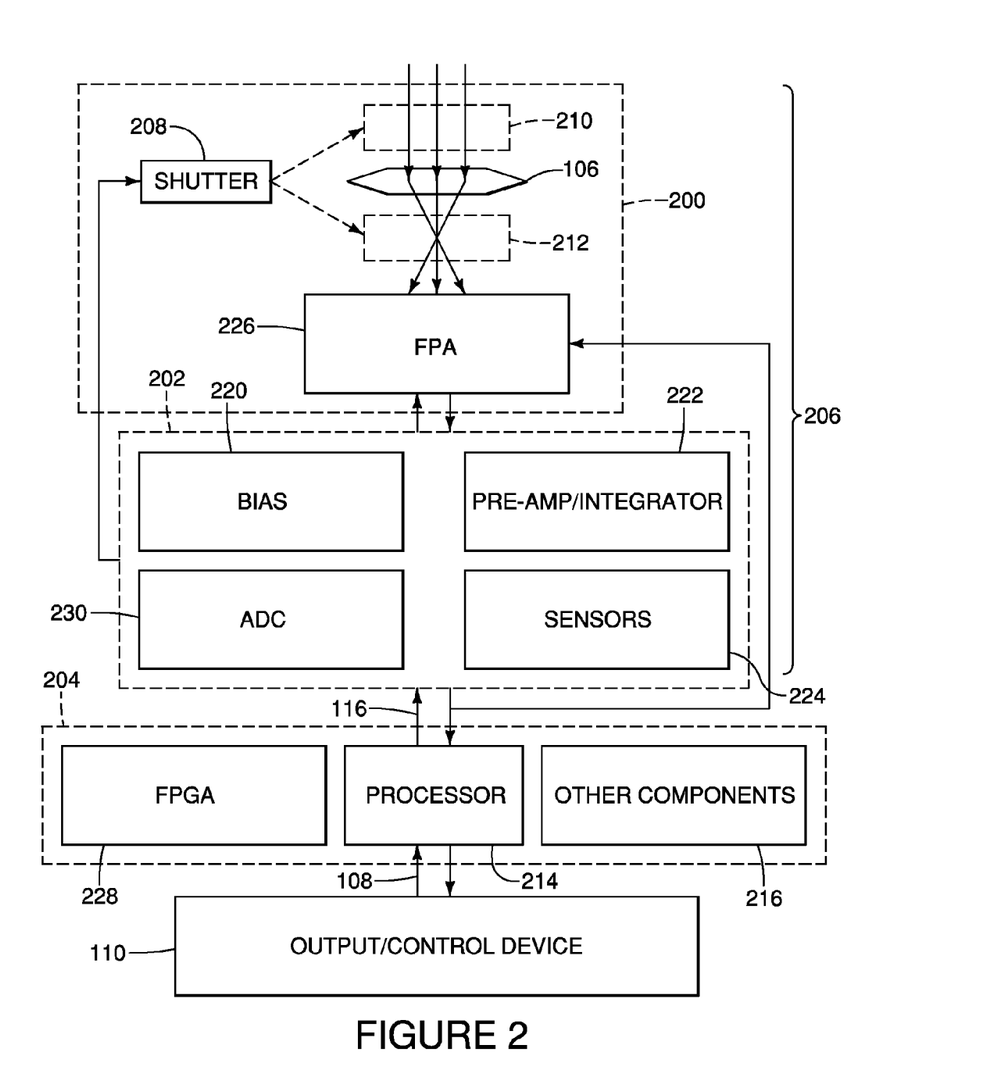
FIG. 2 is a component level block diagram of an infrared imaging device according to some embodiments of the invention.

With reference to FIG. 2, electronic components of the infrared imaging probe 100 will now be discussed. Generally the infrared imaging probe 100 can be described as having three stages: an optical stage 200, a distal stage 202 and a processing stage 204. In some embodiments according to the invention, the optical stage 200 and distal stage 202 (collectively referred to here as the "front end stages 206") reside in the distal housing 104 of the infrared imaging probe 100, and are connected with the processing stage 204 by an electrically isolating connection 116. In most embodiments, the processing stage 204 does not reside at the distal end of the wand 102. Instead, the processing stage 204 can be coupled with the proximal end of the wand 102, for example in the handle 114. Alternatively, in some embodiments, the non-distally located processing stage 204, is located within a separate housing that is not coupled to the wand. The output connection 108 provides for connection from the processing stage 204, wherever located, to an output/control device 110. In another aspect of the invention, the infrared imaging probe 100 does not include a processing stage 204, rather, the functionality of the processing stage 204 (and in some embodiments, at least a portion of the functionality of the distal stage 202) is incorporated into the output/control device 110.

In operation, the infrared imaging probe 100 receives image information in the form of infrared energy through the lens 106, and in turn, the lens 106 directs the infrared energy onto the focal plane array (FPA) 226. The combined functioning of the lens 106 and FPA 226 enables further electronics within the infrared imaging probe 100 to create an image based on the image view captured by the lens 106, as described below.

The FPA 226 can include a plurality of infrared detector elements (not shown), e.g., including bolometers, photon detectors, or other suitable infrared detectors well known in the art, arranged in a grid pattern (e.g., an array of detector elements arranged in horizontal rows and vertical columns). The size of the array can be provided as desired and appropriate given the desire or need to limit the size of the distal housing to provide access to tight or enclosed areas. For example, many embodiments have an array of 50×50 detector elements, but the invention should not be limited to such. In fact, for certain applications, an array as small a single detector (i.e. a 1×1 array) may be appropriate. (It should be noted a infrared imaging probe 100 including a single detector, should be considered within the scope of the terms "imaging probe" and "imager" as they are used throughout this application, even though such a device may not be used to create an "image"). Alternatively, some embodiments can incorporate very large arrays of detectors. In some embodiments involving bolometers as the infrared detector elements, each detector element is adapted to absorb heat energy from the scene of interest (focused upon by the lens 106) in the form of infrared radiation, resulting in a corresponding change in its temperature, which results in a corresponding change in its resistance. With each detector element functioning as a pixel, a two-dimensional image or picture representation of the infrared radiation can be further generated by translating the changes in resistance of each detector element into a time-multiplexed electrical signal that can be processed for visualization on a display or storage in memory (e.g., of a computer). Further circuitry downstream from the FPA 226, as is described below, is used to perform this translation. Incorporated on the FPA 226 is a Read Out Integrated Circuit (ROIC), which is used to output signals corresponding to each of the pixels. Such ROIC is commonly fabricated as an integrated circuit on a silicon substrate. The plurality of detector elements may be fabricated on top of the ROIC, wherein their combination provides for the FPA 226. In some embodiments, the ROIC can include components discussed elsewhere in this disclosure (e.g. an analog-to-digital converter (ADC) 230) incorporated directly onto the FPA circuitry. Such integration of the ROIC, or other further levels of integration not explicitly discussed, should be considered within the scope of this disclosure.

As described above, the FPA 226 generates a series of electrical signals corresponding to the infrared radiation received by each infrared detector element to represent a thermal image. A "frame" of thermal image data is generated when the voltage signal from each infrared detector element is obtained by scanning all of the rows that make up the FPA 226. Again, in certain embodiments involving bolometers as the infrared detector elements, such scanning is done by switching a corresponding detector element into the system circuit and applying a bias voltage across such switched-in element. Successive frames of thermal image data are generated by repeatedly scanning the rows of the FPA 226, with such frames being produced at a rate sufficient to generate a video representation (e.g. 30 Hz, or 60 Hz) of the thermal image data.

In some embodiments, optical stage components can further include a shutter 208. A shutter 208 can be externally 210 or internally 212 located relative to the lens 106 and operate to open or close the view provided by the lens 106. As is known in the art, the shutter 208 can be mechanically positionable, or can be actuated by an electro-mechanical device such as a DC motor or solenoid. Embodiments of the invention may include a calibration or setup software implemented method or setting which utilize the shutter 208 to establish appropriate bias (e.g. see discussion below) levels for each detector element.

The distal stage 202 includes circuitry (distal circuitry) for interfacing with and controlling the optical stage 200. In addition, the distal stage 202 circuitry initially processes and transmits collected infrared image data to the processing stage 204. More specifically, the signals generated by the FPA 226 are initially conditioned by the distal stage 202 circuitry of the infrared imaging probe 100. In certain embodiments, as shown, the distal stage 202 circuitry includes a bias generator 220 and a pre-amp/integrator 222. In addition to providing the detector bias, the bias generator 220 can optionally add or subtract an average bias current from the total current generated for each switched-in detector element. The average bias current can be changed in order (i) to compensate for deviations to the entire array of resistances of the detector elements resulting from changes in ambient temperatures inside the infrared imaging probe 100 and (ii) to compensate for array-to-array variations in the average detector elements of the FPA 226. Such bias compensation can be automatically controlled by the infrared imaging probe 100 or software, or can be user controlled via input to the output/control device 110 or processing stage 204. Following provision of the detector bias and optional subtraction or addition of the average bias current, the signals can be passed through a pre-amp/integrator 222. Typically, the pre-amp/integrator 222 is used to condition incoming signals, e.g., prior to their digitization. As a result, the incoming signals can be adjusted to a form that enables more effective interpretation of the signals, and in turn, can lead to more effective resolution of the created image.

Subsequently, the conditioned signals are sent downstream into the processing stage 204 of the infrared imaging probe 100.

In some embodiments, the distal stage 202 circuitry can include one or more additional elements for example, additional sensors 224 or an ADC 230. Additional sensors 224 can include, for example, temperature sensors, visual light sensors (such as a CCD), pressure sensors, magnetic sensors, etc. Such sensors can provide additional calibration and detection information to enhance the functionality of the infrared imaging probe 100. For example, temperature sensors can provide an ambient temperature reading near the FPA 226 to assist in radiometry calculations. A magnetic sensor, such as a Hall effect sensor, can be used in combination with a magnet mounted on the lens to provide lens focus position information. Such information can be useful for calculating distances, or determining a parallax offset for use with visual light scene data gathered from a visual light sensor.

An ADC 230 can provide the same function and operate in substantially the same manner as discussed below, however its inclusion in the distal stage 202 may provide certain benefits, for example, digitization of scene and other sensor information prior to transmittal via the electrically isolating connection 116. In some embodiments, the ADC 230 can be integrated into the ROIC, as discussed above, thereby eliminating the need for a separately mounted and installed ADC 230.

Because of the electrical isolation of the distal circuitry (discussed below), some embodiments include a separate power supply for the front-end stages 206. For example, a battery can be installed within the front-end assembly 112 to power the distal circuitry, FPA 226 and other distal components.

As discussed above, the front end stages 206 are generally located within the distal housing 104 of the infrared imaging probe 100. Embodiments according to the invention include an electrically isolating connection 116 between the front end stages 206 and the processing stage 204. The isolating connection 116 in combination with a non-conductive wand allows for the gathering of scene data without providing a conductive path between the distal wand end and the user who typically grips the infrared imaging probe 100 at the proximal end of the wand. Thus, the infrared imaging probe 100 can be used to view electrically active components with significantly reduced risk of electrical shock to the user.

Figure 3:
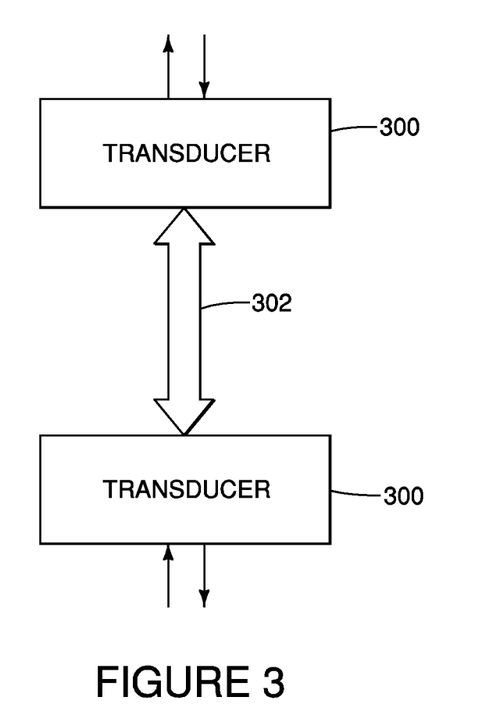
FIG. 3 is a block diagram of an electrically isolating connection according to some embodiments of the invention.

The electrical isolation can be accomplished by various methods. For example, with reference to the isolation schematic of FIG. 3, an electrically isolating connection 116 can generally include two transducers 300 coupled by a non-electrically conductive communication medium 302 (generally corresponding to the isolating connection 116 of FIG. 1). In certain embodiments, the transducers 300 are opto-electrical transducers, translating electrical signals into optical pulses and vice versa. With such transducers, a fiber optic connection medium can be used to transfer optical signals generated by one transducer 300 to the other transducer 300, and vice versa. Alternatively, in some embodiments, the non-electrically conductive communication medium 302 can be an electromagnetic wave transmissible medium such as, for example, air. In such an example, the transducers 300 can be in wireless communication with each other. In such case, the transducers 300 can include wireless antennas, and any number of wireless communication protocols may be used, for example, Bluetooth or WiFi.

In the schematic of FIG. 2, the electrically isolating connection 116 is represented as being separate from the distal stage 202. However, it should be understood that components of the electrically isolating connection 116, such as a transducer 300, can be integrated into distal stage 202. Likewise, a transducer 300 on the proximal end of the electrically isolating connection 116 can be integrated with the processing stage 204 or can be a separate component.

Generally, the processing stage 204, can include one or more of a field-programmable gate array (FPGA) 228, a complex programmable logic device (CPLD) controller and a processor 214 (e.g., computer processing unit (CPU) or digital signal processor (DSP)). These elements manipulate the conditioned scene image data delivered from the front end stages 206 in order to provide output scene data that can be displayed or stored for use by the user. Subsequently, the processing stage 204 circuitry (processing circuitry) sends the processed data to the output/control device 110.

In addition to providing needed processing for infrared imagery, the processing stage 204 circuitry can be employed for a wide variety of additional functions. For example, in some embodiments, the processor 214 can perform temperature calculation/conversion (radiometry), combine scene information with data and/or imagery from other sensors, or compress and translate the image data. Additionally, in some embodiments, the processor 214 can interpret and execute commands from the output/control device 110. This can involve processing of various input signals and transferring those signals via the electrically isolating connection 116 to the front end stages 206 where components at the front end (e.g. motors, or solenoids) can be actuated to accomplish the desired control function. Exemplary control functions can include adjusting the focus, opening/closing a shutter, triggering sensor readings, adjusting bias values, etc. Moreover, input signals may be used to alter the processing of the image data that occurs at the processing stage 204.

The processing stage 204 circuitry can further include other components 216 to assist with the processing and control of the infrared imaging probe 100. For example, as discussed above, in some embodiments, an ADC 230 can be incorporated into the processing stage 204. In such a case, analog signals conditioned by the front-end stages 206 are not digitized until reaching the processing stage 204. Moreover, some embodiments can include additional on board memory for storage of processing command information and scene data, prior to transmission to the output/control device 110. In addition, some embodiments may include one or more controls for controlling device functionality independent of the output/control device 110. For example, the infrared imaging probe 100 may include a knob or buttons installed in the handle for adjusting the focus or triggering the shutter.

As described above, the output connection 108 is preferably a standard connection such as USB, Firewire, or Ethernet. The general operation of the output connection 108 resembles that of the insulating connection 116 shown in FIG. 3, i.e. a pair of transducers 300 coupled via a transmission medium 302. It should be noted that because the output connection 108 resides between components electrically isolated from the potentially hazardous target scene, it is not necessary to provide a non-conductive connection medium as described above. This not to say that non-conductive connection media 302 (such as those described above) cannot be used, but merely that standard connectors, which are typically conductive, can be used. Moreover, the processing stage 204 circuitry need not be directly connected to the output/control device 110 as shown. For example, in some embodiments, the infrared imaging probe 100 includes a connection to an intermediate network or system, for example, the Internet or a LAN. Communication protocols of the intermediate system can be used to provide data transfer between the infrared imaging probe 100 and one or more output/control devices 110 similarly connected to the intermediate system.

The output/control device 110 to which the infrared imaging probe 100 is connected can include any number of devices. For example, the output/control device 110 can include one or more of a digital multimeter, a personal computer, a personal digital assistant, a display device, and a cellular phone. Typical output/control devices 110 include a display capable of displaying the image generated from the scene data collected by the infrared imaging probe 100. Some output/control devices 110 may further include one or more input interfaces such as buttons, or a graphical user interface to allow the user to control or alter the operation of the infrared imaging probe 100.

In another aspect of the invention, the infrared imaging probe 100 (shown in FIG. 1) does not include a processing stage 204. Rather, the functionality of the processing stage 204 (and in some embodiments, at least a portion of the functionality of the distal stage 202) is incorporated into the output/control device 110. In this aspect, the electrically isolating connection 116 can connect directly to an output/control device 110. The functionality of the front-end (generally the analog control of the optical stage) remains with the distal stage 202 circuitry, but the output signal from the distal stage 202 circuitry arrives at the output/control device 110 un-processed. In such embodiments, the output/control device 110 can include an optical input, for example, to receive the electrically isolating connection 116. Further, the output/control device 110 can include software instructions or additional hardware to accomplish the processing for which the processing stage was responsible in the above described embodiments. In some embodiments, the output/control device 110 is equipped to process analog data sent from the distal stage 202 circuitry, while in other embodiments, the distal stage 202 circuitry includes an ADC 230 (as discussed above) to provide a digital signal to the output/control device 110.

Figure 4A:
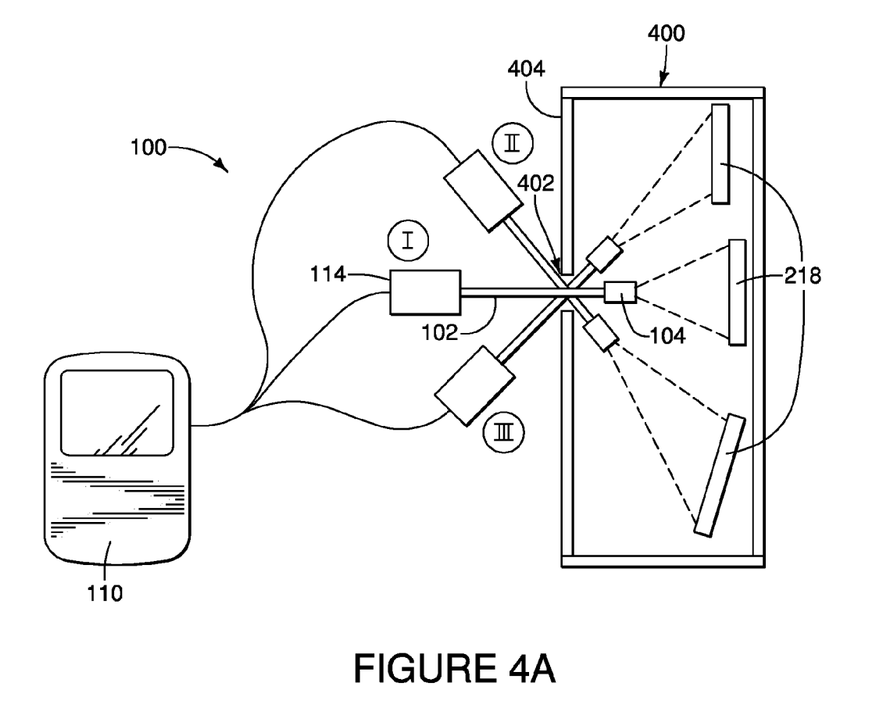
FIG. 4A is a side sectional view of an enclosure being imaged according to embodiments of the invention.
Figure 4B:
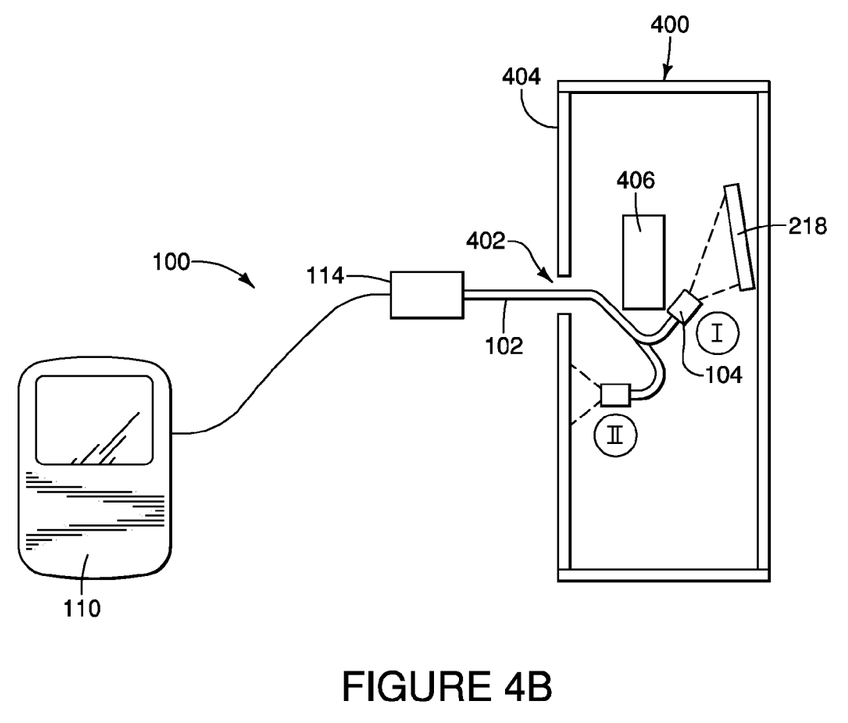
FIG. 4B is a side sectional view of an enclosure being imaged according to embodiments of the invention.

As shown in FIGS. 4A and 4B, infrared imaging probes 100 according to embodiments of the invention can be used in the field of preventative maintenance of electrical equipment. Here, electrical equipment/components 218 within a closed enclosure 400 can be viewed without requiring the enclosure 400 to be opened, or the electrical equipment/components 218 within to be powered down. In each exemplary use shown, the distal housing 104 of the infrared imaging probe 100 has been inserted into the enclosure 400 through an access opening 402 within a panel 404 of the enclosure 400. The access opening 402 can be any aperture through the panel sized large enough to receive the distal housing 104. In some embodiments, the access opening 402 can be a portal installed within the panel 404 designed to meet safety standards regarding electrical enclosures, such as those provided by the National Electrical Manufacturers Association (NEMA). A user positioned outside of the enclosure can grip the infrared imaging probe 100 by its handle 114 and maneuver the distal end to provide the desired view which can be displayed or stored on the connected output/control device 110. In such a use, the desire to electrically isolate the distal end of the wand 102 becomes apparent. The electrically isolating connection 116 and non-conductive wand 102 (both described above) prevent the formation of a conductive path from the distal housing 104 through the user gripping the infrared imaging probe 100 to ground. Thus, the risk of arcing can be avoided.

In FIG. 4A, an infrared imaging probe 100 having a generally straight, rigid wand 102 is used to inspect operating electrical equipment/components 218. The infrared imaging probe 100 can be inserted straight (indicated as Position I) into the enclosure 400 to view electrical equipment/components 218 directly aligned with the access opening 402. To view electrical equipment/components 218 in the bottom of the enclosure 400, the handle 114 of the infrared imaging probe 100 can be pivoted upward (e.g. to Position II). Likewise, the user can pivot the handle 114 of the infrared imaging probe 100 downward (e.g. to Position III) to view electrical equipment/components 218 in the top of the enclosure 400. Moreover, the infrared imaging probe 100 can be pivoted side-to-side to view electrical equipment/components 218 outside of the horizontal field of view of the infrared imaging probe 100.

In FIG. 4B, an infrared imaging probe 100 having a bendable, or articulatable wand 102 has been inserted through the access opening 402. In Position I, the wand 102 has been bent such that the distal housing 104 can maneuver around an obstacle 406 within the enclosure 400 to view electrical equipment/components 218 that would otherwise be hidden from line of sight view. In an alternative position (e.g. Position II), a bendable wand 102 can be used to obtain other hard to reach views, such as the inner surface of the panel 404 in which the access opening 402 is installed.

In another example, a infrared imaging probe 100 according to embodiments of the invention can be used as a bench tool alongside for example, a signal generator, multimeter, and other electronic analysis and design tools. An engineer, technician, tester, or designer of electronic devices can use a thermal imaging wand according to the invention to thermally analyze components at their workbench. Specifically, in some applications such as, for example, consumer electronics, design constraints may require circuit boards and electronic components to be installed in small, tight packages. Embodiments of the invention can be positioned relative to such packages so as to obtain a proper contextual frame for analysis of the thermal profile of the device, or a portion thereof.

While the invention has been described in conjunction with specific embodiments thereof, it is evident that many alternatives, modifications, and variations will be apparent to those skilled in the art in light of the foregoing description. Accordingly, it is intended to embrace all such alternatives, modifications, and variations, which fall within the spirit and broad scope of the invention or as set forth in the appended claims.

What is claimed is:

1. An infrared imaging system comprising:
    an infrared imaging probe, including:
        an elongate wand having a proximal end and a distal end, the distal end being electrically isolated from the proximal end,
        a front-end assembly coupled to the distal end of the wand and comprising a lens, a focal plane array, and distal circuitry, the lens being configured to receive image information in the form of infrared energy and direct the infrared energy onto the focal plane array, the distal circuitry being adapted to process signals from the focal plane array and produce an output signal,
        a handle coupled to the proximal end of the wand, and processing circuitry connected to and electrically isolated from the distal circuitry, the processing circuitry being coupled to the proximal end of the wand and providing an electrically conductive output connection, the processing circuitry being adapted to receive and process the output signal, the electrical isolation of the wand distal and proximal ends combined with the electrical isolation of the distal circuitry and processing circuitry eliminating all conductive paths between the proximal end and the distal end of the wand, whereby a user can grip the infrared imaging probe at the proximal end of the wand with reduced risk of electrical shock from the distal end of the wand;

an output or control device separate from and not physically supported by the wand; and a conductor extending between and electrically connectable to the output connection and the output or control device, the processing circuitry being adapted to process the output signal for electrical transmission to the output or control device via the output connection and the conductor.

2. The infrared imaging system of claim 1, wherein the distal circuitry comprises one or more of a bias generator, a pre-amplifier, and an integrator.

3. The infrared imaging system of claim 2, wherein the distal circuitry further comprises an A/D converter.

4. The infrared imaging system of claim 1, wherein the front-end assembly further comprises one or more sensors.

5. The infrared imaging system of claim 4, wherein the one or more sensors is a temperature sensor.

6. The infrared imaging system of claim 1, wherein the wand comprises a non-conductive material.

7. The infrared imaging system of claim 6, wherein the non-conductive material is carbon fiber.

8. The infrared imaging system of claim 1, wherein the distal circuitry and processing circuitry are connected and electrically isolated by an optical connection.

9. The infrared imaging system of claim 1, wherein the distal circuitry and processing circuitry are connected and electrically isolated by a wireless connection.

10. The infrared imaging system of claim 1, wherein the processing circuitry comprises a field-programmable gate array/complex programmable logic device controller.

11. The infrared imaging system of claim 1, wherein the output connection comprises a USB connection.

12. The infrared imaging system of claim 1, wherein the output or control device comprises one or more of a digital multimeter, a personal computer, a personal digital assistant, a display device, and a cellular phone.

13. The infrared imaging system of claim 1, wherein the focal plane array comprises a microbolometer array.

14. The infrared imaging system of claim 13, wherein the microbolometer array includes a 50 by 50 grid of microbolometers.

15. The infrared imaging system of claim 1, wherein the lens comprises one or more of a standard field of view lens, a narrow field of view lens, and a wide-angle lens.

16. The infrared imaging system of claim 1, wherein the front-end assembly further comprises a visible light camera.

17. An infrared imaging system comprising:
an infrared imaging probe, including:
a wand having a proximal end and a distal end, the distal end being electrically isolated from the proximal end, and the wand including a handle coupled to the proximal end of the wand, a front-end assembly coupled to the distal end, the front-end assembly configured to receive image information in the form of infrared energy and condition the image information to produce an unprocessed output signal, processing circuitry connected to and electrically isolated from the front-end assembly and configured to receive and process the unprocessed output signal from the front-end assembly, the processing circuitry being proximate the proximal end of the wand, an electrically conductive output connection proximate the proximal end of the wand and coupled to the processing circuitry, and an electrically isolating connector connecting the front-end assembly to the processing circuitry and configured to facilitate the communication of the unprocessed output signal from the front-end assembly to the processing circuitry, the electrical isolation of the wand distal and proximal ends combined with the electrical isolation of the electrically isolating connector eliminating all conductive paths between the proximal end and the distal end of the wand, whereby a user can grip the proximal end of the wand with reduced risk of electrical shock from the distal end of the wand; and an output or control device separate from and not physically supported by the wand; and a conductor extending between and electrically connectable to the output connection and the output or control device, the processing circuitry being adapted to process the output signal for electrical transmission to the output or control device via the output connection and the conductor.

18. The infrared imaging system of claim 17, wherein the processing circuitry is adapted to process the output signal for output to the output or control device.

19. An infrared imaging system comprising:
an infrared imaging probe, including:
an elongate wand having a proximal end and a distal end, the distal end being electrically isolated from the proximal end, an image collecting assembly coupled to the distal end of the wand, the assembly configured to receive image information in the form of infrared energy and process the image information to produce an output signal, a handle coupled to the proximal end of the wand, processing circuitry connected to and electrically isolated from the image collecting assembly, the processing circuitry being located at the proximal end of the wand and providing an electrically conductive output connection, and wherein the electrical isolation of the wand distal and proximal ends combined with the electrical isolation of the processing circuitry eliminates all conductive paths between the proximal end and the distal end of the wand, whereby a user can grip the infrared imaging probe at the proximal end of the wand with reduced risk of electrical shock from the distal end of the wand; and an output or control device separate from and not physically supported by the wand; and a conductor extending between and electrically connectable to the output connection and the output or control device, the processing circuitry being adapted to process the output signal for electrical transmission to the output or control devices via the output connection and the conductor.

20. The infrared imaging system of claim 19, wherein the image collecting assembly comprises a lens, and a focal plane array having an integrated digital output.

* * * * *